(12) United States Patent
Nii et al.

(10) Patent No.: US 8,048,535 B2
(45) Date of Patent: Nov. 1, 2011

(54) ELECTROLUMINESCENT DEVICE

(75) Inventors: Kazumi Nii, Minami-Ashigara (JP); Tatsuya Igarashi, Minami-Ashigara (JP); Saisuke Watanabe, Minami-Ashigara (JP); Toshihiro Ise, Minami-Ashigara (JP); Hisashi Okada, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 1088 days.

(21) Appl. No.: 10/560,735

(22) PCT Filed: Sep. 8, 2004

(86) PCT No.: PCT/JP2004/013385
§ 371 (c)(1),
(2), (4) Date: Dec. 15, 2005

(87) PCT Pub. No.: WO2005/029923
PCT Pub. Date: Mar. 31, 2005

(65) Prior Publication Data
US 2007/0099024 A1 May 3, 2007

(30) Foreign Application Priority Data
Sep. 24, 2003 (JP) ............................... P.2003-331515

(51) Int. Cl.
*H01L 51/54* (2006.01)

(52) U.S. Cl. ........ 428/690; 428/917; 313/504; 313/506; 252/301.16; 252/301.27; 257/40; 257/103

(58) Field of Classification Search .................. 428/690, 428/917; 313/504, 506; 257/40, E51.044
See application file for complete search history.

(56) References Cited

U.S. PATENT DOCUMENTS

| | | | |
|---|---|---|---|
| 6,310,360 B1 | 10/2001 | Forrest et al. | |
| 2002/0008233 A1* | 1/2002 | Forrest et al. | 257/40 |
| 2002/0028329 A1* | 3/2002 | Ise et al. | 428/336 |
| 2002/0074935 A1 | 6/2002 | Kwong et al. | |
| 2002/0086180 A1* | 7/2002 | Seo et al. | 428/690 |
| 2002/0101154 A1* | 8/2002 | Seo et al. | 313/506 |
| 2002/0182441 A1* | 12/2002 | Lamansky et al. | 428/690 |
| 2006/0057427 A1* | 3/2006 | Tsukahara et al. | 428/690 |
| 2008/0054799 A1* | 3/2008 | Satou | 313/504 |

FOREIGN PATENT DOCUMENTS

| | | |
|---|---|---|
| EP | 1162674 A3 | 12/2001 |
| EP | 1221473 A1 | 7/2002 |
| EP | 1317005 A2 | 6/2003 |
| JP | 2002-100476 A | 4/2002 |
| JP | 2002-319491 A | 10/2002 |
| JP | 2003-68466 A | 3/2003 |
| JP | 2003-520391 A | 7/2003 |

OTHER PUBLICATIONS

European Search Report in related European Application No. 04773058.5 mailed Jun. 16, 2010.
European Search Report in related European Application No. 04773058.5-2111 mailed Feb. 7, 2011.

* cited by examiner

Primary Examiner — Callie Shosho
Assistant Examiner — Michael H Wilson
(74) Attorney, Agent, or Firm — Birch, Stewart, Kolasch & Birch, LLP

(57) ABSTRACT

An organic electroluminescent device comprising a pair of electrodes and a light emitting layer, a hole transport layer containing a hole transporting material, and an electron transport layer provided between the pair of electrodes wherein, the light emitting layer contains at least two host materials and at least one red phosphorescent material, and the hole transporting material in the hole transport layer has a small ionization potential than the two host materials in the light emitting layer.

2 Claims, No Drawings

ELECTROLUMINESCENT DEVICE

TECHNICAL FIELD

This invention relates to an organic electroluminescent device (hereinafter abbreviated as "OELD" and sometimes referred to as "EL device") capable of converting electrical energy into light to emit light.

BACKGROUND ART

OELDs have been drawing attention as promising display devices because of their capabilities of emitting light of high brightness at a low driving voltage. For the purpose of postponing the life (endurance) of OELDs, that is, suppressing increase in driving voltage and decrease in luminance with time, investigations have been conducted into various structures of hole injecting materials, hole transporting materials, luminescent materials, host materials, electron transporting materials, and electron injecting materials.

Among fluorescent devices using a single excited state for light emission so far developed for improving endurance are those containing an electron transporting compound selected from a metal complex having a nitrogen-containing ligand, a nitrogen-containing heterocyclic compound, and a silicon-containing cyclic compound and, as a host material, an anthryl compound (see, e.g., JP-A-2001-284050). A mixture of a non-polar organic compound capable of transporting both electrons and holes and, as a host, an organic compound that is more polar than the transporting compound is proposed (see, e.g., European patent application publication No. 1221473). Incorporation of a host into a luminescent device using a triplet excited state capable of high luminescence efficiency is also disclosed (see, e.g., JP-A-2002-313583, JP-A-2002-313584, JP-A-2002-313585, and JP-A-2002-319492). However, these devices still need improvements on efficiency, color purity, and endurance. Moreover, the triplet red light emitting devices using a mixed host proposed in JP-A-2002-313584 and JP-A-2002-313585 supra are unsuited to industrial production due to the complexities of the methods of production.

DISCLOSURE OF THE INVENTION

An object of the present invention is to provide an OELD satisfactory in luminescence characteristics and endurance and superior in suitability to production.

As a result of extensive investigations, the present inventors have found that the above object is accomplished by an OELD comprising a pair of electrodes and having provided between the electrodes a light emitting layer, a hole transport layer, and an electron transport layer. The light emitting layer contains at least two host materials and at least one red phosphorescent material. The hole transporting material has a small ionization potential (IP) than the two host materials.

The OELD of the invention embraces the following preferred embodiments:
1) The at least one red phosphorescent material in the light emitting layer has a lowest triplet state energy level ($T_1$) of 167.6 kJ/mol (40 kcal/mol) to 230.5 kJ/mol (55 kcal/mol).
2) All the host materials in the light emitting layer are non-metal-complex compounds.
3) The lowest triplet state energy level of each of the at least two host materials of the light emitting layer in its film form is higher than that of the red phosphorescent material.
4) At least one of the host materials in the light emitting layer comprises a compound having a heterocyclic skeleton containing at least two hetero atoms.
5) The host material comprising a compound having a heterocyclic skeleton containing at least two hetero atoms is represented by formula (I):

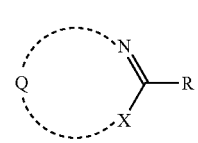

wherein R represents a hydrogen atom or a substituent; X represents —O—, —S—, =N— or =N—Ra; Ra represents a hydrogen atom, an aliphatic hydrocarbon group, an aryl group or a heterocyclic group; and Q represents an atomic group necessary to form a condensed heterocyclic ring together with N and X.

6) The host material comprising the compound having a heterocyclic skeleton containing at least two hetero atoms contains a compound represented by formula (H-I):

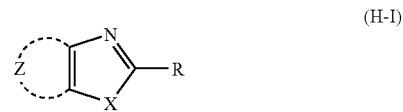

wherein R represents a hydrogen atom or a substituent; X represents —O—, —S—, =N— or =N—Ra; Ra represents a hydrogen atom, an aliphatic hydrocarbon group, an aryl group or a heterocyclic group; and Z represents an atomic group necessary to form an aromatic ring.

7) The host material comprising the compound having a heterocyclic skeleton containing at least two hetero atoms contains a compound represented by formula (H-II):

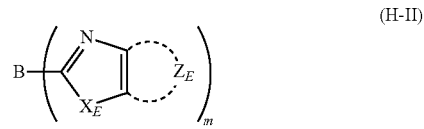

wherein $X_E$ represents —O—, —S—, =N— or =N—Ra; Ra represents a hydrogen atom, an aliphatic hydrocarbon group, an aryl group or a heterocyclic group; $Z_E$ represents an atomic group necessary to form an aromatic ring; B represents a linking group; and m represents an integer of 2 or greater.

8) The host material comprising the compound having a heterocyclic skeleton containing at least two hetero atoms contains a compound represented by formula (H-III):

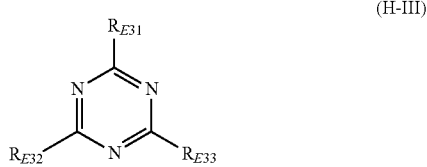

wherein $R_{E31}$, $R_{E32}$, and $R_{E33}$ each represent a hydrogen atom, an aliphatic hydrocarbon group, an aryl group or a heterocyclic group.

9) The host material comprising the compound having a heterocyclic skeleton containing at least two hetero atoms contains a compound represented by formula (H-IV):

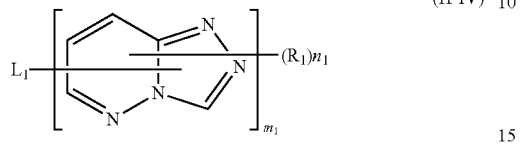

(H-IV)

wherein $R_1$ represents a substituent; $L_1$ represents a linking group; $n_1$ represents 0 or an integer of 1 to 4; and $m_1$ represents an integer of 2 or greater.

10) The host material comprising the compound having a heterocyclic skeleton containing at least two hetero atoms contains a compound represented by formula (H-V):

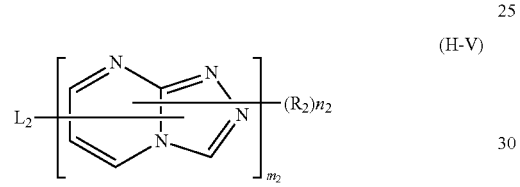

(H-V)

wherein $R_2$ represents a substituent; $L_2$ represents a linking group; $n_2$ represents 0 or an integer of 1 to 4; and $m_2$ represents an integer of 2 or greater.

11) The host material comprising the compound having a heterocyclic skeleton containing at least two hetero atoms contains a compound represented by formula (H-VI):

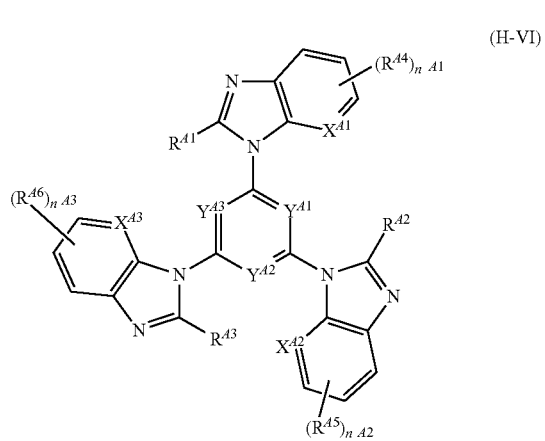

(H-VI)

wherein $R^{A1}$, $R^{A2}$, and $R^{A3}$ each represent a hydrogen atom or an aliphatic hydrocarbon group; $R^{A4}$, $R^{A5}$, and $R^{A6}$ each represent a substituent; $n^{A1}$, $n^{A2}$, and $n^{A3}$ each represent 0 or an integer of 1 to 3; $X^{A1}$, $X^{A2}$, and X each represent a nitrogen atom or C—$R^X$; $R^X$ represents a hydrogen atom or a substituent; $Y^{A1}$, $Y^{A2}$, and $Y^{A3}$ each represent a nitrogen atom or C—$R^{YX}$; and $R^{YX}$ represents a hydrogen atom or a substituent.

12) The host material comprising the compound having a heterocyclic skeleton containing at least two hetero atoms contains a compound represented by formula (H-VII):

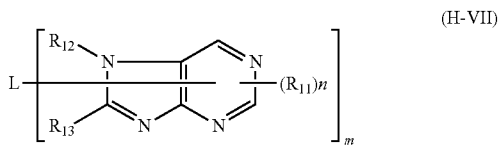

(H-VII)

wherein $R_{11}$ represents a substituent; $R_{12}$ represents a hydrogen atom, an aliphatic hydrocarbon group, an aryl group or a heterocyclic group; $R_{13}$ represents a hydrogen atom or a substituent; n represents an integer of 0 to 2; L represents a single bond or a linking group; and m represents an integer of 2 or greater.

13) The electron transport layer contains a compound represented by formula (E1):

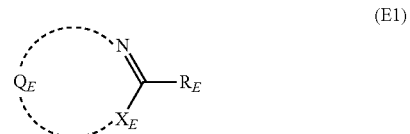

(E1)

wherein $R_E$ represents a hydrogen atom or a substituent; $X_E$ represents —O—, —S—, =N— or =N—$R_a$; $R_a$ represents a hydrogen atom, an aliphatic hydrocarbon group, an aryl group or a heterocyclic group; and $Q_E$ represents an atomic group necessary to form a heterocyclic ring together with N and $X_E$.

14) The electron transport layer contains a compound represented by formula (E-II):

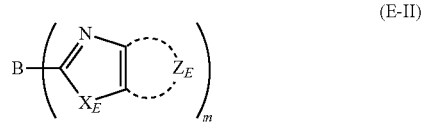

(E-II)

wherein $X_E$ represents —O—, —S—, =N— or =N—$R_a$; $R_a$ represents a hydrogen atom, an aliphatic hydrocarbon group, an aryl group or a heterocyclic group; $Z_E$ represents an atomic group necessary to form an aromatic ring; B represents a linking group; and m represents an integer of 2 or greater.

15) The electron transport layer contains a compound represented by formula (E-III):

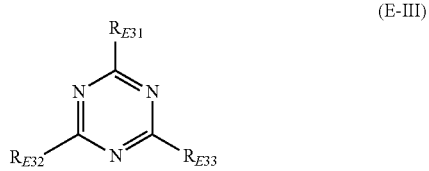

(E-III)

wherein $R_{E31}$, $R_{E32}$, and $R_{E33}$ each represent a hydrogen atom, an aliphatic hydrocarbon group, an aryl group or a heterocyclic group.

16) The electron transport layer contains a compound represented by formula (E-IV):

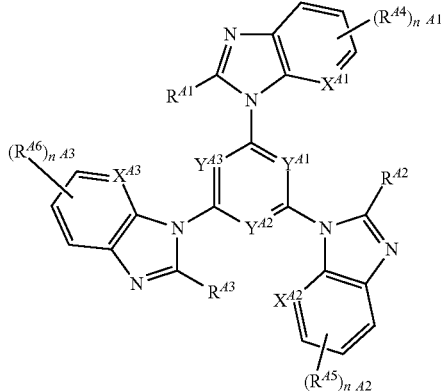

(E-IV)

wherein $R^{A1}$, $R^{A2}$, and $R^{A3}$ each represent a hydrogen atom or an aliphatic hydrocarbon group; $R^{A4}$, $R^{A5}$, and RAE each represent a substituent; $n^{A1}$, $n^{A2}$, and $n^{A3}$ each represent an integer of 0 to 3; $X^{A1}$, $X^{A2}$, and $X^{A3}$ each represent a nitrogen atom or C—$R^X$; $R^X$ represents a hydrogen atom or a substituent; $Y^{A1}$, $Y^{A2}$ and $Y^{A3}$ each represent a nitrogen atom or C—$R^{YX}$; and $R^{YX}$ represents a hydrogen atom or a substituent.

17) An OELD comprising a pair of electrodes and a light emitting layer, a hole transport layer, and an electron transport layer provided between the pair of electrodes, the hole transport layer and the electron transport layer each adjoining the light emitting layer, the light emitting layer containing at least two host materials and at least one red phosphorescent material, and at least one of the host materials in the light emitting layer is a compound represented by formula (I):

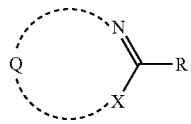

(I)

wherein R represents a hydrogen atom or a substituent; X represents —O—, —S—, =N— or =N—Ra; Ra represents a hydrogen atom, an aliphatic hydrocarbon group, an aryl group or a heterocyclic group; and Q represents an atomic group necessary to form a condensed heterocyclic ring together with N and X.

Throughout the specification and claims, the symbol "=" in =N— means a double bond between X and Q, and the symbol "=" in =N—$R_a$ means two single bonds; one between X and Q, and the other between X and the carbon atom to which R and N are bonded.

The OELD of the invention is superior in luminescence characteristics, such as color purity and external quantum efficiency $\phi_{EL}$, and endurance (life), such as reduced changes in driving voltage and luminance with time.

BEST MODE FOR CARRYING OUT THE INVENTION

The present invention provides an OELD having a pair of electrodes and a light emitting layer, a hole transport layer, and an electron transport layer provided in between the pair of electrodes, which is characterized in that the light emitting layer contains at least two host materials and at least one red phosphorescent material. A similar triplet red light emitting device is disclosed in JP-A-2002-305085, in which the light emitting layer contains as a host a mixture comprising a hole transporting material, an electron transporting material, and optionally a blocking material that form the adjacent hole transport layer, electron transport layer, and blocking layer, respectively. The disclosure teaches that the layer design reduces the energy barrier at the interface between the light emitting layer and the adjacent layer to help smooth carrier transfer thereby extending the device life. However, where a light emitting layer is designed to contain, as a host, a compound that is used as a hole transporting material, an electron transporting material or a blocking material in the adjacent layer, the range of the compounds that can be shared is limited in view of the capability of injecting and transporting holes or injecting and transporting electrons from the electrode. That is, it is difficult to select a compound that is sufficiently stable from the standpoint of endurance. For example, JP-A-2002-305085 cited supra uses a mixed host containing BAlq. A metal complex, such as BAlq, generates low-stability radical cations on current application and has insufficient endurance.

The feature of the present invention resides in that at least two host materials are used in the light emitting layer and that the hole transporting material in the hole transport layer has a smaller ionization potential (IP) than any of the host materials to make an energy difference at the interface between the layers. The hole injection properties are thus controlled by taking advantage of that energy difference thereby to adjust the region of radical cation generation. In preferred embodiments of the invention, non-complex type host materials, which are more stable than complex type host materials, are used in the light emitting layer to further improve the device stability.

The El device of the present invention contains at least one phosphorescent material, a material that emits phosphorescence. The phosphorescent material which can be used in the invention is not limited but preferably includes transition metal complexes. The center metal of the transition metal complexes preferably includes, but is not limited to, iridium, platinum, rhenium, and ruthenium. Iridium and platinum are still preferred, with iridium being particularly preferred. Of transition metal complexes ortho-metalated complexes are much preferred. "Ortho-metalated complex" is a generic term given to the compounds described, e.g., in Yamamoto Akio, *Yukikinzokukagaku-kiso to ohyo*, Shokabo Publishing Co., 1982, p150 and 232 and H. Yersin, Photochemistry and Photophysics of Coordination Compounds, Springer-Verlag, 1987, pp. 71-77 and 135-146.

The phosphorescent material preferably has a phosphorescence quantum efficiency of 70% or higher, still preferably 80% or higher, particularly preferably 85% or higher, at 20° C. The phosphorescence life-time (room temperature) of the phosphorescent material is not particularly limited but preferably 1 ms or shorter, still preferably 100 μs or shorter, particularly preferably 10 μs or shorter.

Phosphorescent materials that can be suitably used in the invention include red phosphorescent materials described, e.g., in U.S. Pat. No. 6,303,238 B1, U.S. Pat. No. 6,097,147, WO 00/57676, WO 00/70655, WO 01/08230, WO 01/39234 A2, WO 01/41512 A1, WO 02/02714 A2, WO 02/15645 A1, JP-A-2001-247859, Japanese Patent Application Nos. 2000-33561, 2001-189539, 2001-248165, 2001-33684, 2001-239281, and 2001-219909, EP 1211257, JP-A-2002-226495, JP-A-2002-234894, JP-A-2001-247859, JP-A-2001-

298470, JP-A-2002-173674, JP-A-2002-203678, JP-A-2002-203679, *Nature*, vol. 395, 151 (1998), *Applied Physics Letters*, vol. 75, 4 (1999), *Polymer Preprints*, vol. 41, 770 (2000), *Journal of American Chemical Society*, vol. 123, 4304 (2001), and *Applied Physics Letters*, vol. 79, 2082 (1999). The red phosphorescent materials described in U.S. Pat. No. 6,303,238 B1, WO 01/41512 A1, WO 02/45466 A1, JP-A-2001-247859, JP-A-2001-298470, JP-A-2002-203678, and Japanese Patent Application Nos. 2002-251871 and 2003-157006 are preferred.

The red luminescent material preferably has a maximum emission wavelength between 550 nm and 700 nm, still preferably between 560 nm and 680 nm, particularly preferably between 580 nm and 660 nm, and a lowest triplet state energy level of 167.6 kJ/mol (40 kcal/mol) to 243.0 kJ/mol (58 kcal/mol), still preferably 188.6 kJ/mol (45 kcal/mol) to 230.5 kJ/mol (55 kcal/mol), particularly preferably 188.6 kJ/mol (45 kcal/mol) to 217.9 kJ/mol (52 kcal/mol).

The phosphorescent compound concentration in the light emitting layer is preferably 1% to 50% by weight, still preferably 1% to 30% by weight, particularly preferably 1% to 10% by weight.

Compounds that can be used as a host material in the light emitting layer are compounds capable of receiving holes and electrons. The lowest triplet state energy of the host material in film form should be equal to or higher than that of the red luminescent material.

Such host materials include 5- to 7-membered heterocyclic compounds containing a hetero atom selected from a nitrogen atom, an oxygen atom, and a sulfur atom (e.g., pyridine, pyrazine, pyrimidine, pyridazine, triazine, quinoxaline, quinazoline, phthalazine, cinnoline, isoquinoline, pteridine, acridine, phenazine, pyrrole, furan, thiophene, tetrazole, pyrazole, imidazole, thiazole, oxazole, indazole, benzimidazole, benzotriazole, benzoxazole, benzothiazole, carbazole, indole, purine, triazolopyridazine, triazolopyrimidine, tetraazaindene, pyralidine, pyrrolopyridine, thiadiazolopyridine, dibenzazepin, and tribenzazepin); polyarylene compounds, fluorene compounds, cyclopentadiene compounds, condensed aromatic carbocyclic compounds (preferably 2- to 5-membered, still preferably 2- to 4-membered, particularly preferably 2- or 3-membered carbocyclic compounds, such as compounds having a naphthalene ring, a phenanthrene ring or an anthracene ring), triarylamine compounds, and metal complexes having a nitrogen-containing heterocyclic compound as a ligand (preferably metal complexes having the partial structure represented by formula (1) shown in JP-A-2000-302754 as a ligand). A preferred range of the formula (1) according to JP-A-2000-302754 applies to the ligand of the metal complexes useful in the invention.

Preferred of them are non-metal-complex type compounds, including triarylamine compounds, carbazole compounds, indole compounds, pyrrole compounds, pyrazole compounds, thiophene compounds, polyarylene compounds, condensed aromatic carbocyclic compounds, and compounds having a heterocyclic skeleton containing two or more hetero atoms.

The compounds having a heterocyclic skeleton containing two or more hetero atoms are compounds having two or more atoms other than carbon and hydrogen atoms in the basic cyclic skeleton, which may be monocyclic or condensed heterocyclic compounds. The heterocyclic skeleton is preferably one having at least two hetero atoms selected from N, O, and S atoms, still preferably a nitrogen-containing aromatic heterocyclic one, particularly preferably one containing two or more nitrogen atoms. The hetero atom may be on an either fused or non-fused position. The heterocyclic skeleton containing two or more hetero atoms includes pyrazole, imidazole, pyrazine, pyrimidine, indazole, benzimidazole, purine, phthalazine, naphthyridine, quinoxaline, quinazoline, cinnoline, pteridine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, triazolopyridazine, triazolopyrimidine, benzimidazole, naphthoimidazole, benzoxazole, naphthoxazole, benzothiazole, naphthothiazole, benzotriazole, tetraazaindene, and triazine. Preferred are 5- or 6-membered rings having two or more hetero atoms per ring. Of the 5-membered rings with two or more hetero atoms, preferred are those which are fused to a heterocyclic ring. Preferred heterocyclic skeletons having two or more hetero atoms per ring include imidazopyridazine, imidazopyridine, imidazopyrazine, benzimidazole, triazolopyridazine, triazolopyrimidine, purine, naphthimidazole, benzoxazole, naphthoxazole, benzothiazole, naphthothiazole, and triazine. Still preferred ones include imidazopyridine, imidazopyrazine, benzimidazole, triazolopyridazine, triazolopyrimidine, purine, naphthimidazole, and triazine. Particularly preferred are imidazopyridine, benzimidazole, triazolopyridazine, triazolopyrimidine, purine, naphthimidazole, and triazine. Imidazopyridine, triazolopyridazine, triazolopyrimidine, purine, and triazine are the most desirable.

Particularly suitable host materials include triarylamine compounds, carbazole compounds, the indole compounds described in JP-A-2002-305084, pyrrole compounds, pyrazole compounds, the polyarylene compounds described in JP-A-2003-27048, the condensed aromatic carbocyclic compounds described in JP-A-2001-192651, and condensed heterocyclic compounds represented by formula (I):

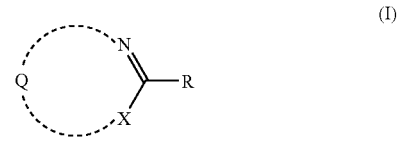

wherein R represents a hydrogen atom or a substituent; X represents —O—, —S—, =N— or =N—Ra; Ra represents a hydrogen atom, an aliphatic hydrocarbon group, an aryl group or a heterocyclic group; and Q represents an atomic group necessary to form a condensed heterocyclic ring together with N and X.

In formula (I), R and X, or R and Q, may be taken together to form a ring. The substituent represented by R includes an alkyl group (preferably one containing 1 to 30 carbon atoms, still preferably one containing 1 to 20 carbon atoms, particularly preferably one containing 1 to 10 carbon atoms, e.g., methyl, ethyl, isopropyl, t-butyl, n-octyl, n-decyl, n-hexadecyl, cyclopropyl, cyclopentyl or cyclohexyl), an alkenyl group (preferably one containing 2 to 30 carbon atoms, still preferably one containing 2 to 20 carbon atoms, particularly preferably one containing 2 to 10 carbon atoms, e.g., vinyl, allyl, 2-butenyl or 3-pentenyl), an alkynyl group (preferably one containing 2 to 30 carbon atoms, still preferably one containing 2 to 20 carbon atoms, particularly preferably one containing 2 to 10 carbon atoms, e.g., propargyl or 3-pentynyl), an aryl group (preferably one containing 6 to 30 carbon atoms, still preferably one containing 6 to 20 carbon atoms, particularly preferably one containing 6 to 12 carbon atoms, e.g., phenyl, p-methylphenyl or naphthyl), an amino group (preferably one having 0 to 30 carbon atoms, still preferably one having 0 to 24 carbon atoms, particularly preferably one having 0 to 20 carbon atoms, e.g., amino, methylamino, dimethylamino, diethylamino, dibenzylamino, diphenylamino, ditolylamino or dinaphthylamino, with diphenylamino, ditolylamino and dinaphthylamino being particularly preferred), an alkoxy group (preferably one containing 1 to 30 carbon atoms, still preferably one containing 1 to 20 carbon atoms, particularly preferably one containing 1 to 10 carbon atoms, e.g., methoxy, ethoxy, butoxy or 2-ethylhexyloxy), an aryloxy group (preferably one containing 6 to 30 carbon atoms, still preferably one containing 6 to 20 carbon atoms, particularly preferably one containing 6 to 12 carbon atoms, e.g., phenoxy, 1-naphthoxy or 2-naphthoxy), a heterocyclic oxy group (preferably one containing 2 to 20 carbon atoms, still preferably one containing 3 to 16 carbon atoms, particularly preferably one containing 4 to 12 carbon atoms, e.g., pyridinoxy, pyrimidinoxy, pyridazinoxy or benzimidazolyloxy), a silyloxy group (preferably one containing 3 to 40 carbon atoms, still preferably one containing 3 to 30 carbon atoms, particularly preferably one containing 3 to 20 carbon atoms, e.g., trimethylsilyloxy, t-butyldimethylsilyloxy or triphenylsilyloxy), an acyl group (preferably one containing 1 to 30 carbon atoms, still preferably one containing 1 to 20 carbon atoms, particularly preferably one containing 2 to 12 carbon atoms, e.g., acetyl, benzoyl, formyl or pivaloyl), an alkoxycarbonyl group (preferably one containing 2 to 30 carbon atoms, still preferably one containing 2 to 20 carbon atoms, particularly preferably one containing 2 to 12 carbon atoms, e.g., methoxycarbonyl or ethoxycarbonyl) an aryloxycarbonyl group (preferably one containing 7 to 30 carbon atoms, still preferably one containing 7 to 20 carbon atoms, particularly preferably one containing 7 to 12 carbon atoms, e.g., phenoxycarbonyl), an acyloxy group (preferably one containing 2 to 30 carbon atoms, still preferably one containing 2 to 20 carbon atoms, particularly preferably one containing 2 to 10 carbon atoms, e.g., acetoxy or benzoyloxy), an acylamino group (preferably one containing 2 to 30 carbon atoms, still preferably one containing 2 to 20 carbon atoms, particularly preferably one containing 2 to 10 carbon atoms, e.g., acetylamino or benzoylamino), an alkoxycarbonylamino group (preferably one containing 2 to 30 carbon atoms, still preferably one containing 2 to 20 carbon atoms, particularly preferably one containing 2 to 12 carbon atoms, e.g., methoxycarbonylamino), an aryloxycarbonylamino group (preferably one containing 7 to 30 carbon atoms, still preferably one containing 7 to 20 carbon atoms, particularly preferably one containing 7 to 12 carbon atoms, e.g., phenoxycarbonylamino), a sulfonylamino group (preferably one containing 1 to 30 carbon atoms, still preferably one containing 1 to 20 carbon atoms, particularly preferably one containing 1 to 12 carbon atoms, e.g., methanesulfonylamino or benzenesulfonylamino), a sulfamoyl group (preferably one having 0 to 30 carbon atoms, still preferably one having 0 to 20 carbon atoms, particularly preferably one having 0 to 12 carbon atoms, e.g., sulfamoyl, methylsulfamoyl, dimethylsulfamoyl or phenylsulfamoyl), a carbamoyl group (preferably one having 1 to 30 carbon atoms, still preferably one having 1 to 20 carbon atoms, particularly preferably one having 1 to 12 carbon atoms, e.g., carbamoyl, methylcarbamoyl, diethylcarbamoyl or phenylcarbamoyl), an alkylthio group (preferably one having 1 to 30 carbon atoms, still preferably one having 1 to 20 carbon atoms, particularly preferably one having 1 to 12 carbon atoms, e.g., methylthio or ethylthio), an arylthio group (preferably one having 6 to 30 carbon atoms, still preferably one having 6 to 20 carbon atoms, particularly preferably one having 6 to 12 carbon atoms, e.g., phenylthio), a heterocyclic thio group (preferably one having 1 to 30 carbon atoms, still preferably one having 1 to 20 carbon atoms, particularly preferably one having 1 to 12 carbon atoms, e.g., pyridylthio, 2-benzimidazolylthio, 2-benzoxazolylthio or 2-benzothiazolylthio), a sulfonyl group (preferably one having 1 to 30 carbon atoms, still preferably one having 1 to 20 carbon atoms, particularly preferably one having 1 to 12 carbon atoms, e.g., mesyl or tosyl), a sulfinyl group (preferably one having 1 to 30 carbon atoms, still preferably one having 1 to 20 carbon atoms, particularly preferably one having 1 to 12 carbon atoms, e.g., methanesulfinyl or benzenesulfinyl), a ureido group (preferably one having 1 to 30 carbon atoms, still preferably one having 1 to 20 carbon atoms, particularly preferably one having 1 to 12 carbon atoms, e.g., ureido, methylureido or phenylureido), a phosphoric acid amide group (preferably one having 1 to 30 carbon atoms, still preferably one having 1 to 20 carbon atoms, particularly preferably one having 1 to 12 carbon atoms, such as diethylphosphoramide or phenylphosphoramide), a hydroxyl group, a mercapto group, a halogen atom (e.g., fluorine, chlorine, bromine or iodine), a cyano group, a sulfo group, a carboxyl group, a nitro group, a hydroxamic acid group, a sulfino group, a hydrazino group, an imino group, a heterocyclic group containing a nitrogen atom, an oxygen atom, a sulfur atom, etc. as a hetero atom (preferably one having 1 to 30 carbon atoms, still preferably 1 to 12 carbon atoms, such as imidazolyl, pyridyl, quinolyl, furyl, thienyl, piperidyl, morpholino, benzoxazolyl, benzimidazolyl, benzothiazolyl, carbazolyl or azepinyl), and a silyl group (preferably one having 3 to 40 carbon atoms, still preferably one having 3 to 30 carbon atoms, particularly preferably one having 3 to 24 carbon atoms, such as trimethylsilyl or triphenylsilyl). These substituents may have a substituent if possible. When there are two or more substituents on R, they may be the same or different. Where possible, the substituents may be taken together to form a ring.

The substituent represented by R is preferably an aliphatic hydrocarbon group, an aryl group or a heterocyclic group, still preferably an aryl group or an aromatic heterocyclic group, particularly preferably an aryl group or a 5- or 6-membered aromatic heterocyclic group, especially preferably an aryl group or a 5- or 6-membered aromatic heterocyclic group having at least one of N, S, and O atoms. The most preferred substituent as R is an aryl group.

X represents O, S, N or N—Ra, and Ra represents a hydrogen atom, an aliphatic hydrocarbon group, an aryl group or a heterocyclic group. The aliphatic hydrocarbon group as Ra includes a straight-chain, branched or cyclic alkyl group (preferably one containing 1 to 20 carbon atoms, still preferably one containing 1 to 12 carbon atoms, particularly preferably one containing 1 to 8 carbon atoms, e.g., methyl, ethyl, isopropyl, t-butyl, n-octyl, n-decyl, n-hexadecyl, cyclopropyl, cyclopentyl or cyclohexyl), an alkenyl group (preferably one containing 2 to 20 carbon atoms, still preferably one containing 2 to 12 carbon atoms, particularly preferably one containing 2 to 8 carbon atoms, e.g., vinyl, allyl, 2-butenyl or 3-pentenyl), and an alkynyl group (preferably one containing 2 to 20 carbon atoms, still preferably one containing 2 to 12 carbon atoms, particularly preferably one containing 2 to 8 carbon atoms, e.g., propargyl or 3-pentynyl). An alkyl group is preferred of them.

The aryl group as Ra is a monocyclic or condensed aryl group preferably containing 6 to 30 carbon atoms, still preferably 6 to 20 carbon atoms, particularly preferably 6 to 12 carbon atoms, including phenyl, 2-methylphenyl, 3-methylphenyl, 4-methylphenyl, 2-methoxyphenyl, 3-trifluoromethylphenyl, pentafluorophenyl, 1-naphthyl, and 2-naphthyl.

The heterocyclic group as Ra is a monocyclic or condensed heterocyclic group preferably containing 1 to 20, still preferably 1 to 12, particularly preferably 2 to 10, carbon atoms. The heterocyclic group is preferably an aromatic one containing at least one of N, O, S, and Se atoms. Examples of the heterocyclic group as Ra are pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzimidazole, benzoxazole, benzothiazole, benzotriazole, tetraazaindene, carbazole, and azepine. Preferred of them are furan, thiophene, pyridine, pyrazine, pyrimidine, pyridazine, triazine, quinoline, phthalazine, naphthyridine, quinoxaline, and quinazoline. Still preferred are furan, thiophene, pyridine, and quinoline. Quinoline is particularly preferred.

The aliphatic hydrocarbon group, aryl group or heterocyclic group represented by Ra may have a substituent. The substituent includes those recited as examples of the substituents represented by R. The preference for the number of carbon atoms of the substituents as R (indicated in the parentheses) also applies to Ra. Ra is preferably an alkyl group, an aryl group or an aromatic heterocyclic group, still preferably an aryl group or an aromatic heterocyclic group, particularly preferably an aryl group.

X is preferably O, N or N—Ra, still preferably N or N—Ra, particularly preferably N or N—Ar, wherein Ar is an aryl group (preferably one having 6 to 30 carbon atoms, still preferably 6 to 20 carbon atoms, particularly preferably 6 to 12 carbon atoms) or an aromatic heterocyclic group (preferably one having 1 to 20 carbon atoms, still preferably 1 to 12 carbon atoms, particularly preferably 2 to 10 carbon atoms), preferably an aryl group.

Q is an atomic group necessary to form a condensed heterocyclic ring together with N and X. The condensed heterocyclic ring completed by Q is preferably an aromatic condensed heterocyclic ring, still preferably an aromatic condensed heterocyclic ring in which the basic ring containing X and the nitrogen atom shown in formula (I) is a 5- to 8-membered aromatic heterocyclic ring, particularly preferably a condensed ring in which the ring containing X and the nitrogen atom shown in formula (I) is a 5- or 6-membered aromatic heterocyclic ring. The hetero ring containing X and the nitrogen atom shown in formula (I) includes imidazole, oxazole, thiazole, selenazole, tellurazole, triazole, tetrazole, oxadiazole, thiadiazole, oxatriazole, thiatriazole, pyrimidine, pyridazine, pyrazine, triazine, and tetrazine rings. Preferred of them are imidazole, oxazole, thiazole, triazole, and triazine rings. Still preferred are imidazole, oxazole, triazole, and triazine rings. Imidazole, triazole, and triazine rings are particularly preferred. Another ring is condensed with the above-described heterocyclic ring to complete the condensed heterocyclic ring represented by N-Q-X.

The condensed heterocyclic ring may have a substituent. The substituent includes those enumerated as examples of the substituents represented by R. Preferred substituents are an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, a sulfonylamino group, a sulfamoyl group, a carbamoyl group, an alkylthio group, an arylthio group, a sulfonyl group, a halogen atom, a cyano group, and a heterocyclic group. Still preferred of them are an alkyl group, an alkenyl group, an aryl group, an alkoxy group, an aryloxy group, a halogen atom, a cyano group, and a heterocyclic group. Particularly preferred are an alkyl group, an aryl group, an alkoxy group, an aryloxy group, and an aromatic heterocyclic group. An alkyl group, an aryl group, an alkoxy group, and an aromatic heterocyclic group are the most preferred.

Of the compounds represented by formula (I) the preferred can be represented by formulae (H-I), (H-III), (H-IV), and (H-V):

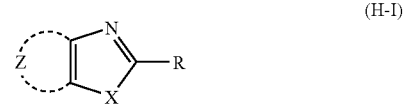

(H-I)

wherein R is as defined above; X represents —O—, —S— or =N—Ra; Ra is as defined above; and Z represents an atomic group necessary to form an aromatic ring.

In formula (H-I), the preferences with respect to R and Ra in X are as noted supra. X is preferably —O— or =N—Ra, still preferably =N—Ra, particularly preferably =N—Ar, wherein Ar is an aryl group (preferably one having 6 to 30 carbon atoms, still preferably 6 to 20 carbon atoms, particularly preferably 6 to 12 carbon atoms) or an aromatic heterocyclic group (preferably one having 1 to 20 carbon atoms, still preferably 1 to 12 carbon atoms, particularly preferably 2 to 10 carbon atoms), preferably an aryl group. The aromatic ring formed by Z includes both an aromatic hydrocarbon ring and an aromatic heterocyclic ring, such as benzene, pyridine, pyrazine, pyrimidine, pyridazine, triazine, pyrrole, furan, thiophene, selenophene, tellurophene, imidazole, thiazole, selenazole, tellurazole, thiadiazole, oxadiazole, and pyrazole rings. Preferred of the aromatic rings are benzene, pyridine, pyrazine, pyrimidine, and pyridazine rings. Still preferred of them are benzene, pyridine, pyrazine, and pyrimidine rings. Particularly preferred are benzene, pyridine, and pyrimidine rings. A pyridine ring is the most preferred. The aromatic ring formed by Z may be fused to a ring to form a condensed ring. The aromatic ring formed by Z may have a substituent including those listed as examples of R. Suitable substituents include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group, and a heterocyclic group. Preferred of them are an alkyl group, an alkenyl group, an aryl group, an alkoxy group, an aryloxy group, a halogen atom, a cyano group, and a heterocyclic group. Still preferred are an alkyl group, an aryl group, an alkoxy group, an aryloxy group, and an aromatic heterocyclic group. Particularly preferred are an alkyl group, an aryl group, an alkoxy group, and an aromatic heterocyclic group.

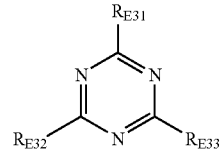

(H-III)

wherein $R_{E31}$, $R_{E32}$, and $R_{E33}$ each represent a hydrogen atom, an aliphatic hydrocarbon group, an aryl group or a heterocyclic group.

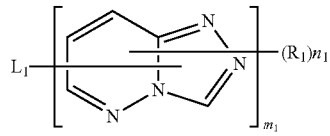
(H-IV)

wherein $R_1$ represents a substituent; $L_1$ represents a linking group; $n_1$ represents 0 or an integer of 1 to 4; and $m_1$ represents an integer of 2 or greater.

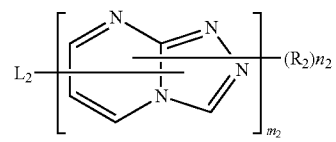
(H-V)

wherein $R_2$ represents a substituent; $L_2$ represents a linking group; $n_2$ represents 0 or an integer of 1 to 4; and $m_2$ represents an integer of 2 or greater.

Of the compounds of formula (H-I) particularly preferred are compounds represented by formulae (H-II), (H-VI), and (H-VII):

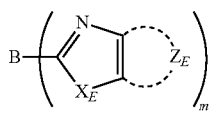
(H-II)

wherein $X_E$ represents —O—, —S—, =N— or =N—Ra; Ra represents a hydrogen atom, an aliphatic hydrocarbon group, an aryl group or a heterocyclic group; $Z_E$ represents an atomic group necessary to form an aromatic ring; B represents a linking group; and m represents an integer of 2 or greater.

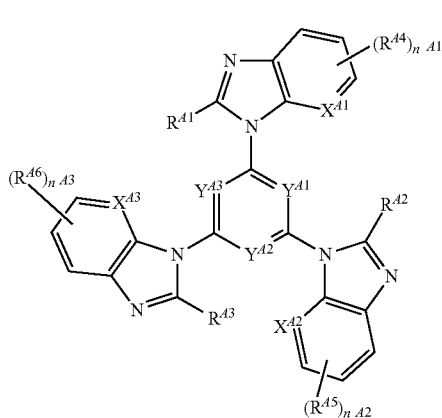
(H-VI)

wherein $R^{A1}$, $R^{A2}$, and $R^{A3}$ each represent a hydrogen atom or an aliphatic hydrocarbon group; $R^{A4}$, $R^{A5}$, and $R^{A6}$ each represent a substituent; $n^{A1}$, $n^{A2}$, and $n^{A3}$ each represent 0 or an integer of 1 to 3; $X^{A1}$, $X^{A2}$, and $X^{A3}$ each represent a nitrogen atom or C—$R^X$; $R^X$ represents a hydrogen atom or a substituent; $Y^{A1}$, $Y^{A2}$, and $Y^{A3}$ each represent a nitrogen atom or C—$R^{YX}$; and $R^{YX}$ represents a hydrogen atom or a substituent.

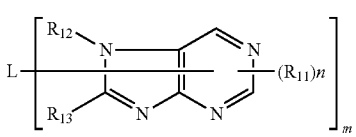
(H-VII)

wherein $R_{11}$ represents a substituent; $R_{12}$ represents a hydrogen atom, an aliphatic hydrocarbon group, an aryl group or a heterocyclic group; $R_{13}$ represents a hydrogen atom or a substituent; n represents an integer of 0 to 2; L represents a single bond or a linking group; and m represents an integer of 2 or greater.

Formula (H-II) according to the present invention has the same meaning as formula (B-II) according to JP-A-2002-319491. A preferred range of the formula (B-II), including formulae (B-III) through (B-X) shown in JP-A-2002-319491, also applies to formula (H-II).

Formula (H-IV) has the same meaning as formula (A) shown in JP-A-2002-100476. A preferred range of the formula (A) applies to formula (H-IV).

Formula (H-VII) has the same meaning as formula (I) shown in JP-A-2002-338579. A preferred range of the former is the same as that of the latter.

Formula (H-III) has the same meaning as formula (C-II) shown in JP-A-2002-319491, and a preferred range of the formula (C-II) also applies to formula (H-III).

Formulae (H-V) and (H-VI) have the same meaning as formulae (I) and (II) shown in JP-A-2002-356489, respectively. A preferred range of the formulae (I) and (II) also applies to formulae (H-V) and (H-VI), respectively.

The OELD of the invention preferably contains at least one of the above-described compounds having a heterocyclic skeleton containing two or more hetero atoms as at least one of the two host materials in the light emitting layer.

Other host materials that can be used in the invention preferably include the compounds represented by formula (I) described in JP-A-2002-100476, particularly compounds represented by formulae (A-1), (B-1), (C-1), and (D-1) shown in JP-A-2002-100476 and the compounds listed below.

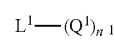
(I)

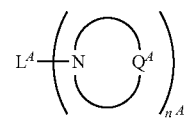
(A-I)

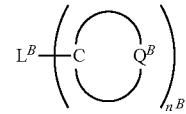
(B-I)

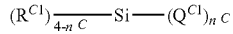
(C-I)

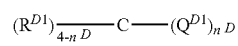
(D-I)

-continued

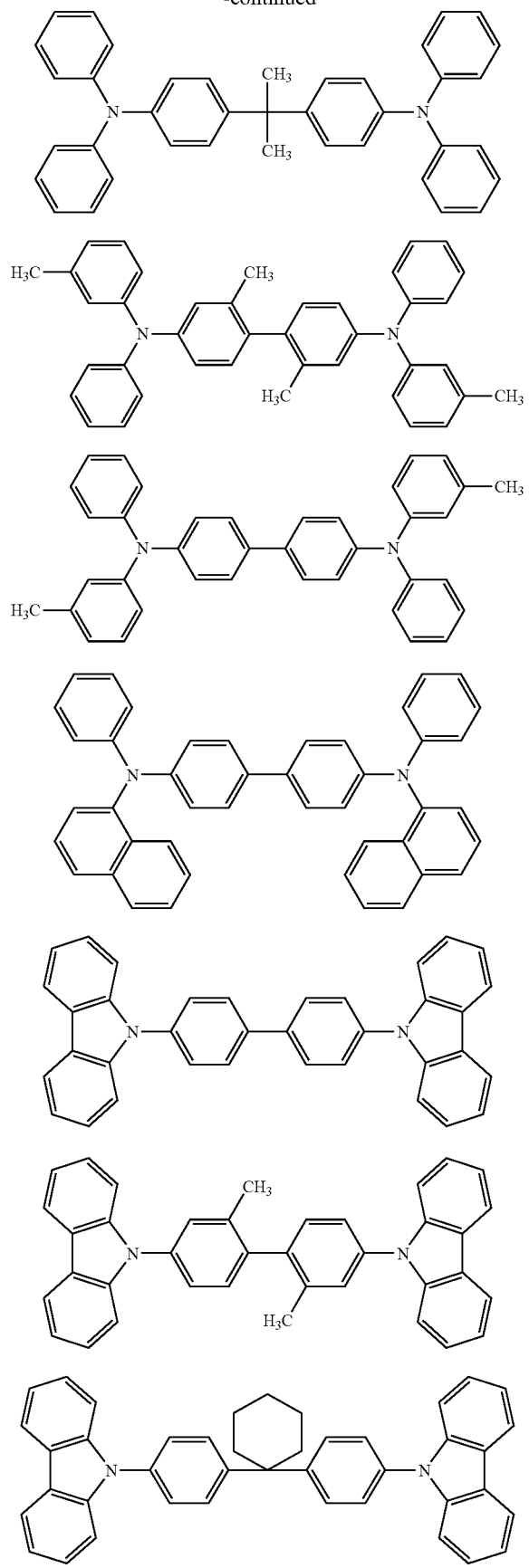

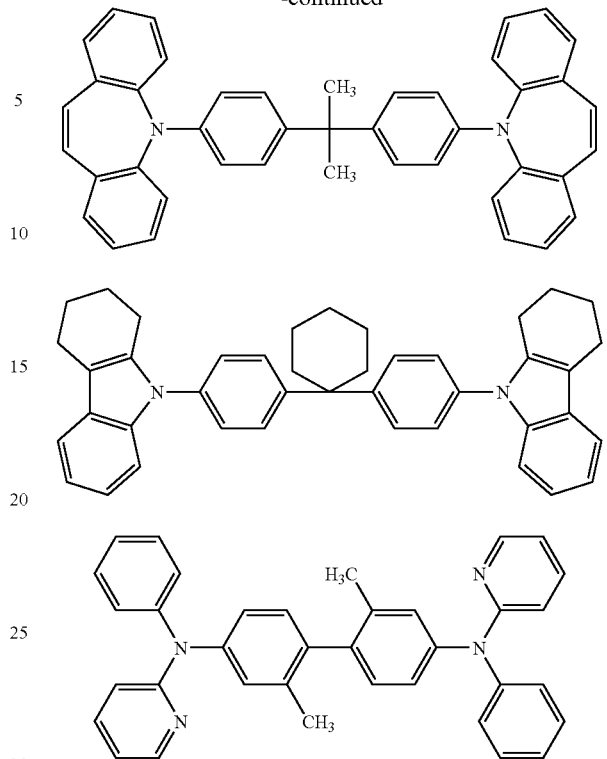

At least one of the host materials in the light emitting layer is preferably present in a concentration of 1% to 99% by weight, still preferably 5% to 90% by weight, particularly preferably 10% to 80% by weight. The rest of the light emitting layer composition is made up of a phosphorescent material and the other host material or other host materials.

It is desirable that all the host materials in the light emitting layer be non-metal-complex compounds. It is more desirable that at least one of the host materials be a compound having a heterocyclic skeleton, particularly a compound containing two or more hetero atoms. It is the most desirable that at least one of the host materials be a condensed heterocyclic compound having two or more hetero atoms in one of the rings forming a condensed ring.

The light emitting layer of the OELD may have at least one multilayer structure composed of an electron transporting compound and a hole transporting compound. The light emitting layer may have other multilayer structures. The number of such a multilayer structure is preferably 2 to 50, still preferably 4 to 30, particularly preferably 6 to 20.

The thickness of each layer making up the multilayer structure is not limited but preferably 0.2 to 20 nm, still preferably 0.4 to 15 nm, particularly preferably 0.5 to 10 nm, especially preferably 1 to 5 nm.

The light emitting layer may have a plurality of domain structures composed of an electron transporting material and a hole transporting material. The light emitting layer may have other domain structures. The size of each domain is preferably 0.2 to 10 nm, still preferably 0.3 to 5 nm, particularly preferably 0.5 to 3 nm, especially preferably 0.7 to 2 nm.

Materials constituting the electron injection and/or transport layer(s) are then described. The electron injection and/or transport layer can be made of any materials that perform at least one of a function of injecting electrons from the cathode, a function of injecting electrons from the cathode, a function of transporting the electrons, and a function of blocking positive holes from the anode. Materials of the electron transport layer include aromatic carbocyclic compounds (e.g., benzene, naphthalene, anthracene, phenanthracene, tetracene, pyrene, pentacene, perylene, coronene, chrysene, picene, pericyclene, acenaphthene, and fluoranthene) having, as a substituent, an electron attracting group (preferably an electron attracting group having a Hammett's sigma p value of 0.2 or greater, particularly an aryl group, an aromatic heterocyclic group, a cyano group, a carbonyl group, a thiocarbonyl group, an oxycarbonyl group, an acylamino group, a carbamoyl group, a sulfamoyl group, a sulfonyl group, an imino group or a halogen atom), nitrogen-containing aromatic heterocyclic compounds (including 5- or 6-membered nitrogen-containing aromatic heterocyclic compounds which may contain an additional hetero atom selected from oxygen, nitrogen, sulfur, and silicon and may form a condensed ring composed of 2 to 10 rings, such as compounds having a pyridine structure, a pyrazine structure, a pyrimidine structure, a pyridazine structure, a pyrrole structure, a pyrazole structure, an imidazole structure, an oxazole structure, a thiazole structure, a triazole structure, or a combination of these structures), and metal complexes.

Specific examples of the electron transporting materials include triazole, oxazole, oxadiazole, imidazole, fluorenone, anthraquinodimethane, anthrone, diphenylquinone, thiopyran dioxide, carbodiimide, fluorenylidenemethane, distyrylpyrazine; aromatic (e.g., naphthalene or perylene) tetracarboxylic acid anhydrides; phthalocyanine; various metal complexes, such as metal complexes of 8-quinolinol derivatives, metallo-phthalocyanines, and metal complexes having benzoxazole or benzothiazole as a ligand; organosilanes; and derivatives of the recited compounds.

Preferred materials to be used in the electron transport layer include compounds represented by formula (E1), which are the compounds represented by formula (I) shown in JP-A-2002-319491, and compounds represented by formula (E-IV), which are the compounds represented by formula (A) shown in JP-A-2002-100476:

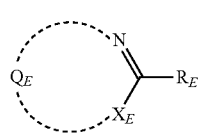

(E1)

wherein $R_E$ represents a hydrogen atom or a substituent; $X_E$ represents —O—, —S—, =N— or =N—$R_a$; $R_a$ represents a hydrogen atom, an aliphatic hydrocarbon group, an aryl group or a heterocyclic group; and $Q_E$ represents an atomic group necessary to form a heterocyclic ring together with N and $X_E$ (refer to formula (I) in JP-A-2002-100476 for the details of $R_E$, $X_E$, and $Q_E$)

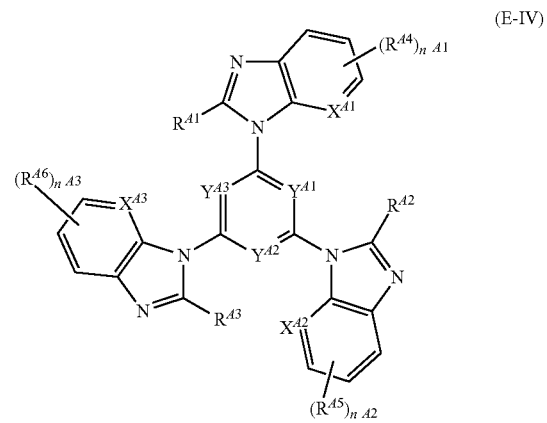

(E-IV)

wherein $R^{A1}$, $R^{A2}$, and $R^{A3}$ each represent a hydrogen atom or an aliphatic hydrocarbon group; $R^{A4}$, $R^{A5}$, and $R^{A6}$ each represent a substituent; $n^{A1}$, $n^{A2}$, and $n^{A3}$ each represent an integer of 0 to 3; $X^{A1}$, $X^{A2}$, and $X^{A3}$ each represent a nitrogen atom or C—$R^X$; $R^X$ represents a hydrogen atom or a substituent; $Y^{A1}$, $Y^{A2}$, and $Y^{A3}$ each represent a nitrogen atom or C—$R^{YX}$; and $R^{YX}$ represents a hydrogen atom or a substituent (for the details of these substituents, refer to formula (A) in JP-A-2002-100476).

Of the compounds represented by formula (E1) the preferred are those represented by formula (E2) and (E-III):

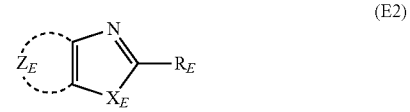

(E2)

wherein $R_E$ and $X_E$ are as defined for formula (E1); and $Z_E$ represents an atomic group necessary to form an aromatic ring (the same as Z in formula (II) shown in JP-A-2002-319491)

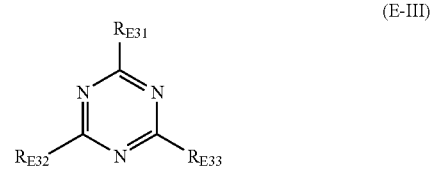

(E-III)

wherein $R_{E31}$, $R_{E32}$, and $R_{E33}$ each represent a hydrogen atom, an aliphatic hydrocarbon group, an aryl group or a heterocyclic group.

Of the compounds represented by formula (E2) preferred are those represented by formula (E-II):

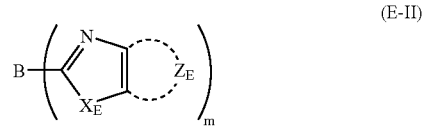

(E-II)

wherein $Z_E$, $X_E$, and B have the same meanings as Z, $X_2$, and B used in formula (B-II) shown in JP-A-2002-319491.

A preferred range of the compounds of formula (E-II) is the same as that of the formula (B-II), i.e., the compounds represented by formulae (B-III) through (B-X) shown in JP-A-2002-319491.

B in formulae (E-II) and (H-II), which represents a linking group, is preferably one composed of C, N, O, S, Si, Ge, etc. B preferably includes a carbon atom, an alkylene group, an alkenylene group, an alkynylene group, an arylene group, a polyvalent aromatic ring, and their combination with a nitrogen atom. The polyvalent aromatic ring may be an aromatic carbon ring or a hetero ring. The hetero ring is preferably an aromatic hetero ring containing an azole ring, a thiophene ring or a furan ring. Still preferably, B is an arylene group, a trivalent aromatic ring, and their combination with a nitrogen atom. Particularly preferably, B is a trivalent aromatic ring or its combination with a nitrogen atom. A benzene-1,3,5-triyl group is the most preferred.

Formula (E-III) has the same meaning as formula (C-II) given in JP-A-2002-319491. A preferred range of the former is the same as that of the latter.

Formula (E-IV) has the same meaning as formula (A) shown in JP-A-2002-100476. A preferred range of the former is the same as that of the latter.

Specific examples of the compounds represented by formula (E1) include, but are not limited to, compound Nos. 205 to 306 and 367 to 381 shown in JP-A-2002-319491.

Methods for forming an organic compound layer of the OELD include, but are not limited to, vacuum deposition by resistance heating or electron beam, sputtering, molecular accumulation, wet coating, ink jet method, printing, and transfer. From the standpoint of film characteristics and ease of production, resistance heating vacuum deposition, wet coating, and transfer are preferred.

The OELD of the invention is an element having a pair of electrodes, i.e., an anode and a cathode, and a light emitting layer or a plurality of organic layers including a light emitting layer interposed between the electrodes. The OELD may have a hole injection layer, a hole transport layer, an electron injection layer, and an electron transport layer in addition to the light emitting layer. Each of the additional layers may have functions other than the intended one meant by the designation of the layer. Each layer can be formed of various materials fit for the intended purpose.

The anode supplies positive holes to a hole injection layer, a hole transport layer, a light emitting layer, etc. Materials making up the anode include metals, alloys, metal oxides, electrically conductive compounds, and mixtures thereof. Those having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and conductive metal oxides; inorganic electrically conductive substances, such as copper iodide and copper sulfide; organic electrically conductive substances, such as polyaniline, polythiophene, and polypyrrole; and laminates of the recited materials and ITO. Conductive metal oxides are preferred. ITO is especially preferred for its productivity, electrical conductivity, and transparency. The thickness of the anode is decided appropriately according to the material and usually ranges from 10 nm to 5 µm, preferably 50 nm to 1 µm, still preferably 100 to 500 nm.

The anode is usually formed on a substrate, such as a soda lime glass plate, an alkali-free glass plate or a transparent resin plate. When a glass substrate is chosen, alkali-free glass is preferred for avoiding leaching of ions from glass. In using soda lime glass, one having a barrier coat of silica, etc. is preferred. The thickness of the substrate is not particularly limited as long as the device can maintain mechanical strength. A glass substrate, for example, usually has a thickness of 0.2 mm or larger, preferably 0.7 mm or larger.

The anode is formed by an appropriate technique selected according to the material. For instance, an ITO layer is formed by electron beam deposition, sputtering, resistance heating vacuum deposition, chemical reaction (e.g., a sol-gel process), coating with an ITO dispersion, and the like.

The anode thus formed may be subjected to cleaning or a like treatment for reducing the driving voltage or increasing luminescence efficiency. For an ITO anode, for instance, a UV-ozone treatment or a plasma treatment is effective.

The cathode supplies electrons to an electron injection layer, an electron transport layer, a light emitting layer, etc. The material making up the cathode is selected taking into consideration adhesion to an adjacent layer, such as an electron injection layer, an electron transport layer or a light emitting layer, ionization potential, stability, and the like. Useful materials include metals, alloys, metal halides, metal oxides, electrically conductive compounds, and mixtures thereof. Examples of useful materials are alkali metals (e.g., Li, Na, and K) and fluorides or oxides thereof, alkaline earth metals (e.g., Mg and Ca) and fluorides or oxides thereof, gold, silver, lead, aluminum, sodium-potassium alloys or mixtures, lithium-aluminum alloys or mixtures, magnesium-silver alloys or mixtures, and rare earth metals (e.g., indium and ytterbium). Preferred of them are those having a work function of 4 eV or less, particularly aluminum, lithium-aluminum alloys or mixtures, and magnesium-silver alloys or mixtures. The cathode may have a single layer structure made of the above-recited material or a laminate structure containing the material. For example, an aluminum/lithium fluoride laminate or an aluminum/lithium oxide laminate is preferred. The thickness of the cathode is selected appropriately according to the material and usually ranges from 10 nm to 5 µm, preferably 50 nm to 1 µm, still preferably 100 nm to 1 µm.

The cathode can be formed by electron beam deposition, sputtering, resistance heating vacuum deposition, wet coating, and like techniques. In vacuum deposition, a single metal may be deposited, or two or more components may be deposited simultaneously. A plurality of metals may be deposited simultaneously to form an alloy cathode, or a previously formulated alloy may be deposited.

The anode and the cathode each preferably have as low sheet resistance as possible, particularly a sheet resistance lower than several hundreds of ohms per square.

Methods of forming the light emitting layer include, but are not limited to, vacuum deposition by resistance heating or electron beam, sputtering, molecular accumulation, wet coating (e.g., spin coating, casting, dip coating), ink jet method, printing, LB method, and transfer. Resistance heating vacuum deposition and wet coating are preferred.

The hole injection layer and the hole transport layer can be of any materials having at least one of a function of injecting holes supplied by the anode, a function of transporting the holes, and a function of blocking the electrons injected from the cathode. Examples of such materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds; conductive oligomers or polymers, such as poly(N-vinylcarbazole) derivatives, aniline copolymers, thiophene oligomers, and polythiophene; organosilanes; carbon films; and the compounds of the present invention. The thickness of the hole injection layer and the hole transport layer is not particularly limited and usually ranges from 1 nm to 5 μm, preferably 5 nm to 1 μm, still preferably 10 to 500 nm. The hole injection layer and the hole transport layer may each have a single layer structure made of one or more of the above-recited materials or a multilayer structure composed of two or more layers having the same or different compositions.

The hole injection layer and the hole transport layer can be formed by vacuum evaporation, LB method, wet coating with a solution or dispersion of the hole injecting/transporting material in a solvent by spin coating, casting, dip coating or like techniques, ink jet method, printing or transfer. Where wet coating techniques are adopted, it is possible to apply a resin component as dissolved or dispersed in the solvent together with the hole injecting/transporting material. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The thickness of the electron injection layer and the electron transport layer is not particularly limited and usually ranges from 1 nm to 5 μm, preferably 5 nm to 1 μm, still preferably 10 to 500 nm. The electron injection layer and the electron transport layer may each have a single layer structure made of one or more of the above-recited materials or a multilayer structure composed of two or more layers having the same or different compositions.

The electron injection layer and the electron transport layer can be formed by vacuum evaporation, LB method, wet coating with a solution or dispersion of the electron injecting/transporting material in a solvent (e.g., spin coating, casting, dip coating), ink jet method, printing, transfer or like techniques. Where wet coating techniques are adopted, it is possible to apply a resin component as dissolved or dispersed in the solvent together with the electron injecting/transporting material. Applicable resin components include those described above with respect to the hole injecting/transporting layers.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal fluorides, e.g., $MgF_2$, LiF, $AlF_3$, and $CaF_2$; $SiO_xN_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, and transfer.

The light-extraction efficiency of the OELD can be improved by various known techniques, such as surface structuring of the substrate (for example, formation of a fine uneven pattern), controlling the refractive index of the substrate, ITO layer or organic layer(s), and controlling the thickness of the substrate, ITO layer or organic layer(s). The improvement in light-extraction efficiency leads to an increase in external quantum efficiency.

The OELD of the invention may be of a so-called top emission type, in which light is emitted from the anode side of the device.

The substrate that can be used in the OELD includes, but is not limited to, inorganic materials, such as yttrium-stabilized zirconia and glass; and polymers, such as polyesters (e.g., polyethylene terephthalate, polybutylene terephthalate, and polyethylene naphthalate), polyethylene, polycarbonate, polyether sulfone, polyarylate, allyl diglycol carbonate, polyimide, polycycloolefins, norbornene resins, poly(chlorotrifluoroethylene), Teflon, and tetrafluoroethylene-ethylene copolymers.

The OELD of the present invention is suited for use in the fields of display devices, displays, backlights, electrophotography, light sources for illumination, recording, exposure, and reading, signs or signboards, interior decorations, optical communications, and so forth.

EXAMPLES

The present invention will now be illustrated in greater detail with reference to Examples, but it should be understood that the present invention is not deemed to be limited thereto.

Comparative Example

An EL device containing two or more host materials and a red phosphorescent compound in its light emitting layer is disclosed in JP-A-2002-313584 and JP-A-2002-313585, in which a mixture of BAlq and α-NPD (N,N'-Diphenyl-N,N'-di((α-naphthyl)-benzidine) is used as a mixed host, and PtOEP (lowest triplet state energy ($T_1$)=45 kcal/mol) is used as a luminescent material.

A comparative EL device was prepared in accordance with that prior art as follows. Copper phthalocyanine was deposited on a cleaned ITO substrate by vacuum evaporation to a thickness of 10 nm. α-NPD was vacuum deposited thereon to a thickness of 40 nm to form a hole transport layer. NPD (as a first host), BAlq (as a second host), and PtOEP (as a luminescent material) were vacuum co-deposited on the α-NPD layer at a deposition rate of 0.4 nm/sec, 0.1 nm/sec, and 0.03 nm/sec, respectively, to a total deposition thickness of 20 nm. BAlq followed by Alq were vacuum deposited thereon to a thickness of 10 nm and 40 nm, respectively. A pattern mask (having a pattern giving a light-emitting area of 2 mm by 2 mm) was put on the thus formed organic thin film, and lithium fluoride was vacuum deposited to a thickness of 5 nm, and aluminum was then vacuum deposited to a thickness of about 500 nm to form a cathode. The resulting stack of layers was then sealed. The resulting EL device was given a sample number 101. The emission wavelength of the device was 648 nm.

Another comparative El device, designated sample 102, was prepared in the same manner as for sample 101, except for replacing PtOEP with I-1 ($T_1$=49 kcal/mol) as a luminescent material. The resulting EL device had an emission wavelength of 620 nm.

Example

After an α-NPD layer was formed in the same manner as in Comparative Example, the first host, second host, and luminescent material shown in Table 1 below were vacuum co-deposited on the α-NPD layer at a deposition rate of 0.4 nm/sec, 0.1 nm/sec, and 0.03 nm/sec, respectively, to a total deposition thickness of 20 nm to form a light emitting layer. The electron transporting material shown in Table 1 was vacuum deposited thereon to a thickness of 50 nm. A cathode was formed, followed by sealing in the same manner as in Comparative Example to prepare an EL device (designated sample Nos. 103 to 107). The emission wavelength of sample 103 was 620 nm.

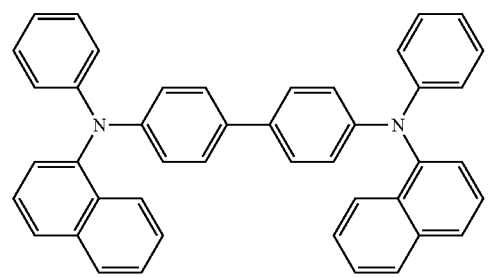

NPD

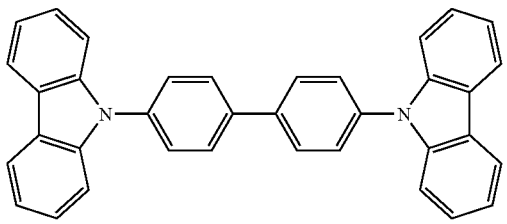

CBP

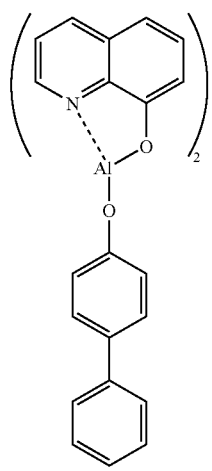

BAlq

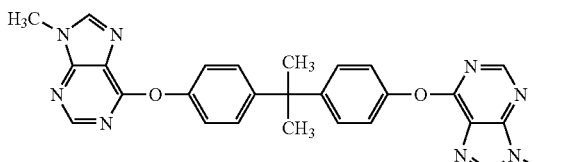

H-2

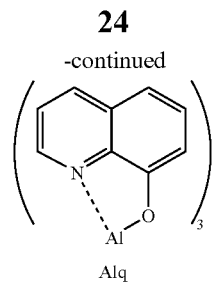

Alq

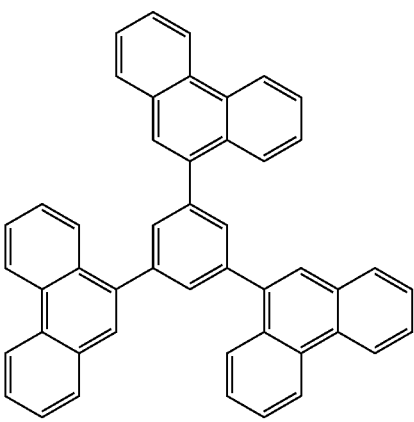

H-3

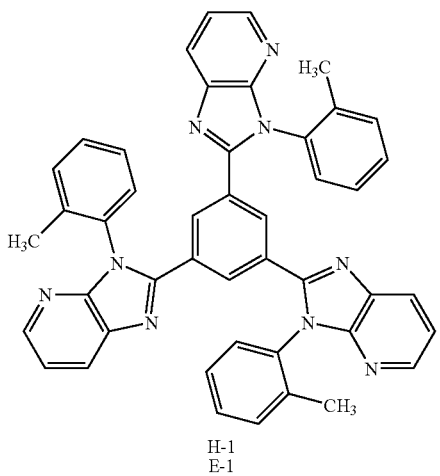

H-1
E-1

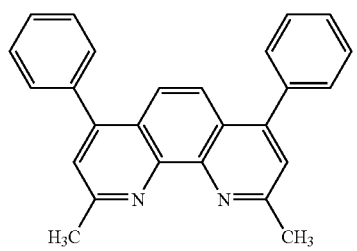

BCP

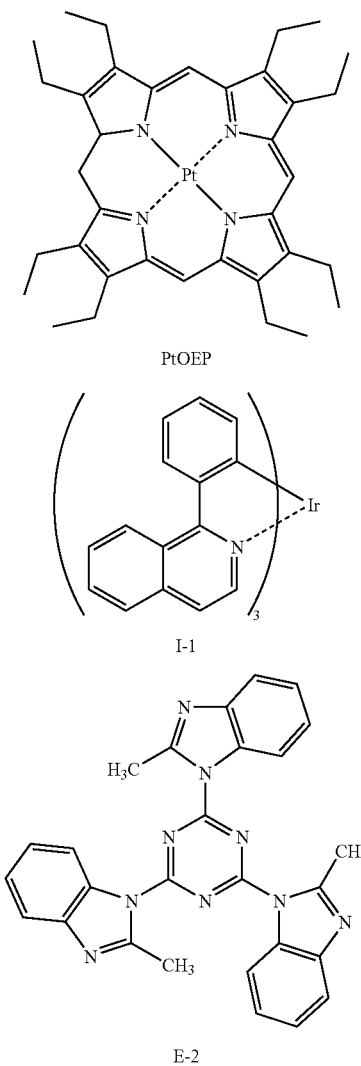

PtOEP

I-1

E-2

The OELDs prepared were evaluated as follows. A constant direct current was applied to the device by use of Source-Measure Unit Model 2400 supplied by Toyo Corp. to cause the device to emit light. The luminance of the light was measured with a luminance meter BM-8 supplied by Topcon to obtain a luminescence efficiency. The emission wavelength was measured with Spectral Analyzer PMA-11 supplied by Hamamatsu Photonics K.K. The results of evaluation are shown in Table 1.

TABLE 1

| Sample No. | 1st Host (IP; eV) | 2nd Host (IP; eV) | Luminescent Material | Electron Transport Material | External Quantum Efficiency | Remark |
|---|---|---|---|---|---|---|
| 101 | NPD (5.4) | BAlq (5.8) | PtOEP | BAlq/Alq | 4.1% | comparison |
| 102 | NPD (5.4) | BAlq (5.8) | I-1 | BAlq/Alq | 5.2% | comparison |
| 103 | CBP (6.0) | BAlq (5.8) | I-1 | BAlq/Alq | 6.5% | invention |
| 104 | CBP (6.0) | BCP (>6.3) | I-1 | BCP/Alq | 7.1% | invention |
| 105 | CBP (6.0) | H-1 (>6.3) | I-1 | E-1 | 9.3% | invention |

TABLE 1-continued

| Sample No. | 1st Host (IP; eV) | 2nd Host (IP; eV) | Luminescent Material | Electron Transport Material | External Quantum Efficiency | Remark |
|---|---|---|---|---|---|---|
| 106 | CBP (6.0) | H-2 (5.8) | I-1 | E-1 | 7.8% | invention |
| 107 | H-3 (5.9) | H-1 (>6.3) | I-1 | E-2 | 8.2% | invention |

Compared with samples 101 and 102 in which a compound used as a hole transporting material is also used as a host, the devices of the present invention (samples 103 to 107) using host materials whose ionization potentials (IP) are greater than that of the hole transporting material exhibit satisfactory luminescence efficiency and endurance. The devices of the invention in which all the host materials in the light emitting layer are non-complex compounds (samples 104 to 107) reach higher luminescence efficiency than sample 103 using a metal complex host material. Those in which a heterocyclic compound having at least two hetero atoms per ring is used as a host material (samples 105 to 107) are particularly superior in luminescence efficiency. Moreover, the OELD of the present invention has a long endurance. Thus, the present invention realizes a triplet luminescent device excellent in luminescence efficiency, color purity (particularly blue color purity), endurance, and aging characteristics, and besides, the device of the invention is suited to industrial production, involving no such complicated operation for vacuum deposition as required in the production of the devices of JP-A-2002-313584 and JP-A-2002-313585.

The invention claimed is:

1. An organic electroluminescent device comprising a pair of electrodes and a light emitting layer, a hole transport layer containing a hole transporting material, and an electron transport layer provided between the pair of electrodes wherein:

all of the host materials in the light emitting layer are non-metal-complex compounds and at least one of the host materials in the light emitting layer is a compound having the formula (H-II)

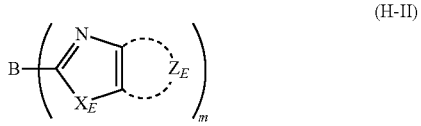

(H-II)

wherein:
$X_E$ represents =N—Ra wherein Ra represents an aryl group;
$Z_E$ represents an atomic group necessary to form a pyridine ring;
B represents a benzene ring; and
m is 3, and wherein
the light emitting layer contacts the hole transport layer and contains at least two host materials and at least one red phosphorescent material which is an ortho-metalated iridium complex,
the hole transporting material in the hole transport layer has a smaller ionization potential than the two host materials in the light emitting layer, and
the at least one red phosphorescent material has a maximum emission wavelength of 550 to 700 nm.

2. The organic electroluminescent device of claim 1, wherein the at least one red phosphorescent material in the light emitting layer has a lowest triplet state energy level of 167.6 kJ/mol to 230.5 kJ/mol.

* * * * *